United States Patent
Thompson et al.

(10) Patent No.: US 9,558,839 B2
(45) Date of Patent: Jan. 31, 2017

(54) POWER FAIL SAVING MODES IN SOLID STATE DRIVE WITH MLC MEMORY

(71) Applicant: OCZ Storage Solutions, Inc., San Jose, CA (US)

(72) Inventors: Leland W. Thompson, Tustin, CA (US); Christopher S. Delaney, Orange, CA (US); Gordon W. Waidhofer, Irvine, CA (US); Ali Aiouaz, San Jose, CA (US)

(73) Assignee: Toshiba Corporation, Tokyo (JP)

( * ) Notice: Subject to any disclaimer, the term of this patent is extended or adjusted under 35 U.S.C. 154(b) by 0 days.

(21) Appl. No.: 14/642,609

(22) Filed: Mar. 9, 2015

(65) Prior Publication Data
US 2016/0268000 A1 Sep. 15, 2016

(51) Int. Cl.
| G11C 11/34 | (2006.01) |
| G11C 16/30 | (2006.01) |
| G11C 11/56 | (2006.01) |
| G11C 16/16 | (2006.01) |

(52) U.S. Cl.
CPC ......... *G11C 16/30* (2013.01); *G11C 11/5635* (2013.01); *G11C 16/16* (2013.01)

(58) Field of Classification Search
CPC ............ G11C 11/5628; G11C 11/5642; G11C 11/5621
USPC .................................... 365/185.03, 228, 229
See application file for complete search history.

(56) References Cited

U.S. PATENT DOCUMENTS

| 7,275,140 B2 * | 9/2007 | Paley .................. G06F 11/1072 711/156 |
| 2010/0226170 A1 * | 9/2010 | Lin ........................ G11C 5/141 365/185.03 |

OTHER PUBLICATIONS

Tseng et al, "*Understanding the Impact of Power Loss on Flash Memory*," DAC 2011, Jun. 5-10, 2011, San Diego, California, USA.
Zheng et al., "*Understanding the Robustness of SSDs under Power Fault*," 11th USENIX Conference on File and Storage Technologies (FAST '13) 271-284, 2013.
Western Digital, "*The Art of SSD Power Fail Protection*," White Paper, Jan. 2013.

* cited by examiner

*Primary Examiner* — Son Dinh
(74) *Attorney, Agent, or Firm* — White & Case LLP

(57) ABSTRACT

A solid state drive has a power failure savings mode that permits a reduction in holdup time for a temporary backup power supply. The solid state drive stores data in a multi-level cell (MLC) mode. In a power fail saving mode system metadata is written in a pseudo Single Level Cell (pSLC) mode. In the normal operating mode page writes are performed in complete blocks. In the power fail save saving mode data from a write buffer is written and additional dummy pages written to reduce the total number of pages that must be written to below a complete block size with the dummy pages providing protection from data corruption.

24 Claims, 9 Drawing Sheets

POWER FAIL SAVING MODES IN SOLID STATE DRIVE WITH MLC MEMORY

FIELD OF THE INVENTION

The present invention is generally related to techniques to respond to a power failure in a solid state drive in which temporary backup power is provided to permit data important for a graceful recovery to be stored. More particularly, the present invention is directed to improving the speed with which important data is written after a power failure.

BACKGROUND OF THE INVENTION

FIG. 1 is a schematic diagram showing the main components of a solid state drive (SSD) in accordance with the prior art. The Solid State Drive includes a non-volatile memory in the form of a multi-level cell (MLC) flash memory array 105, a flash controller 110, dynamic random access memory (DRAM) 120, and a host interface 130. The host interface connects to a host computer (not shown in FIG. 1) which interfaces to the flash controller 110. The flash controller 110 interfaces to the flash memory array 105 and the smaller amount of DRAM 120. The DRAM 120 may be integrated on the same chip as the flash memory controller 110 or exist as a separate memory device or devices.

The DRAM 120 may be used to buffer user data for both read and write commands from the host to the flash memory controller 110. It may also be used to store system data such as L2P (Logical to Physical) address tables, an operational log (where the sequence of events processed by the controller can be saved for later inspection), and statistics concerning the read and write activity and SMART (Self-Monitoring, Analysis and Reporting Technology) data logging. This system data is commonly referred to as 'metadata' collectively.

For read commands, a portion of the DRAM 120 may be assigned to act as a read cache, where frequently accessed user data may be stored in the cache after reading from the memory array and then subsequent reads for the same user data can be serviced more quickly from the cache. The data in the cache is only a secondary copy of the data held in non-volatile flash memory. Consequently, in the event of a power failure no action need be taken to save or protect the data in the read cache, as the primary copy is always safe in the non-volatile flash memory array.

For write commands, the DRAM 120 may be used as a buffer to act as a staging point for data being sent between the flash memory controller 110 and the flash memory array 105. Typically, writing directly to flash memory is much slower than writing to DRAM. Data written to NAND flash memory must be written in units on flash pages regardless of the host write size. Additionally, the data written to the flash memory must be written in complete flash blocks, also known as flash erase blocks, where a block includes many individual pages.

Ideally, all the flash pages in one flash block should be written at the same time, or at least within a short period and certainly with no long intervening period between the writing of one incomplete block and the completion of the writing of the remaining pages in that block. The reason is that the data in incomplete flash blocks may suffer corruption and errors due to migration of charge across the physical boundary between memory cells in pages that have been written (programmed) and adjacent memory cells in those pages that have yet to be written (i.e., un-programmed and still in the erased state).

Therefore, writing first to a DRAM 120 serving as a buffer confers several advantages, including being able to respond much more quickly to the host to confirm a status that the data has been written, while the actual writing of the flash memory may take place in the background. The writing of data to flash memory can also be made more efficient by consolidating smaller writes into single page writes or even complete erase block writes composed of many pages in order to avoid problems due to charge migration across the programmed/un-programmed page boundary.

The effect of a sudden power failure on flash memory has been documented in the literature. For example, the paper entitled "Understanding the Impact of Power Loss on Flash Memory", be Tseng, Grupp and Swanson, DAC '11 Proceedings of the 48th Design Automation Conference (2011), describes how writing activity to the flash memory that is stopped in mid-flow may leave the data partially-written in an indeterminate state. In particular, the paper describes how a power failure can "corrupt data already present in the flash device" and "negatively impact the integrity of future data written to the device."

One way to address some of the problems caused by a power failure is to include a temporary backup power supply to support a graceful shutdown. The power of an SSD may be provided in different ways, but typically comes from a host. When the host power shuts down, the SSD thus also powers down. It is common to provide a temporary backup power supply 140 for a SSD. A power fail detection circuit 150 may be included to detect a power supply failure. The temporary backup power supply 140 may, for example, be a small battery or a super-capacitor. The temporary backup supply may be a separate component or may be packaged with the SSD in a single unit.

However, even when a temporary back-up supply is available, the backup supply is typically designed to have only a limited capability sufficient to support a graceful shutdown. Thus, after a power failure is detected, steps still have to be taken to try to gracefully complete any essential pending operations and to save any essential user data and system metadata stored in volatile DRAM 120 to the non-volatile flash memory array 105. Two of these essential activities are covered in "The Art of SSD Power Fail Protection," white paper by WD, a Western Digital company (2013), which mentions the importance of saving to non-volatile storage of any 'in-flight' data associated with write-back caching and the logical to physical mapping table. The contents of "The Art of SSD Power Fail Protection" are hereby incorporated by reference.

In the event of a power failure, therefore, the first priority is to save any in-flight data that has been acknowledged to the host as having been written. Due to the use of the DRAM 120 as a buffer, there can be situations where a power failure occurs after data is acknowledged to the host, but before all of the associated data in the DRAM buffer 120 has been written to the flash memory array 105. Priority is thus given to save data that has been written to the SSD that has been acknowledged back to the host, but which has only been buffered in the volatile DRAM and which has not yet been written to the flash memory. Data which has not yet been acknowledged need not necessarily be saved, as the host will interpret the associated write command as having failed and will take appropriate action. The industry's "best practice" for MLC flash memory is that after a power failure, the write data in the write data buffer 122 is written in complete upper/lower (most significant and least significant bit) page pairs and in complete erase block units.

The system data 124, or metadata, which includes the logical to physical mapping table, also needs to be saved to have a graceful recovery. In accordance with industry best practice, the system data 124 is stored in MLC mode in complete upper/lower page pairs and in complete erase block units.

The backup power supply 140 comes at a price in terms of hardware size and cost. The backup power supply needs to be scaled to have the required "hold up time," which is the time the backup power supply will hold up the operating voltages of the SSD for it to function. Once the voltages fall below a critical value, the drive will shut down.

In order to ensure that both the write-cached data and the metadata is saved, the time for both operations to complete must be determined and this defines the minimum hold up time. The minimum hold up time, in turn, will determine the minimum amount of battery capacity or the super-capacitor size of the temporary backup power supply 140.

The extra cost of providing batteries or super-capacitors as a backup power supply 140 in a SSD is not inconsiderable. Additionally, there is a desire in many applications to reduce the size of the SSD, including associated components packaged with the SSD. Therefore, there is a need to minimize the time required to write the essential data to non-volatile memory after a power supply failure of a SSD. Additionally, there is a need minimize the amount of data that has to be written after a power supply failure.

SUMMARY OF THE INVENTION

A solid state drive (SSD) has access to a temporary backup power supply that provides holdup power in the event of a power failure. The solid state drive has a power failure savings mode that permits a reduction in the holdup time that is required for a graceful shutdown, which in turn relaxes the requirements on the backup power supply. The solid state drive stores data in a multi-level cell (MLC) mode. In a power fail saving mode, the system metadata is written in a pseudo Single Level Cell (pSLC) mode.

In one embodiment, an additional reduction in holdup time is achieved using a modified MLC mode for buffered data that is in-transit at the time of the power failure. In a normal operating mode, page MLC writes are performed in complete blocks. In a power fail save saving mode, a modified MLC write procedure is used in which data does not have to be written in complete blocks. In the modified MLC write procedure, data from a write buffer is written to the flash memory and additional dummy pages are written to provide protection from data corruption. The dummy pages may be randomly programmed to have an average charge distribution similar to that of scrambled data pages. The number of dummy pages may further be selected to prevent corruption of the data pages from a charge discontinuity or other effects.

In one embodiment in a power fail savings mode, the system metadata is stored in a reserved stripe in the MLC flash memory. The reserved stripe is a region of MLC memory allocated to operating in a pSLC mode. To prevent wear leaving and other forms of degradation, the reserve stripe may be rotated during the lifetime of the flash memory by allocating new blocks of flash memory as a new reserved stripe, followed by de-allocating the previous reserved stripe. The location of the reserved stripe may be recorded in a non-volatile memory accessible by the flash memory controller.

In one embodiment, a power failure method includes operating a flash memory in a multi-level cell (MLC) mode. In response to detecting a power failure, a power fail saving mode is initiated under backup power. In the power fail saving mode, system metadata is saved in a region of the flash memory using a pseudo single level cell (pSLC) mode. In one embodiment, the power fail saving mode includes saving buffered write data to flash memory in a modified MLC mode. The modified MLC mode may include writing a sequence of pages of buffered write data followed by a sequence of dummy pages.

DETAILED DESCRIPTION

Figure 1:
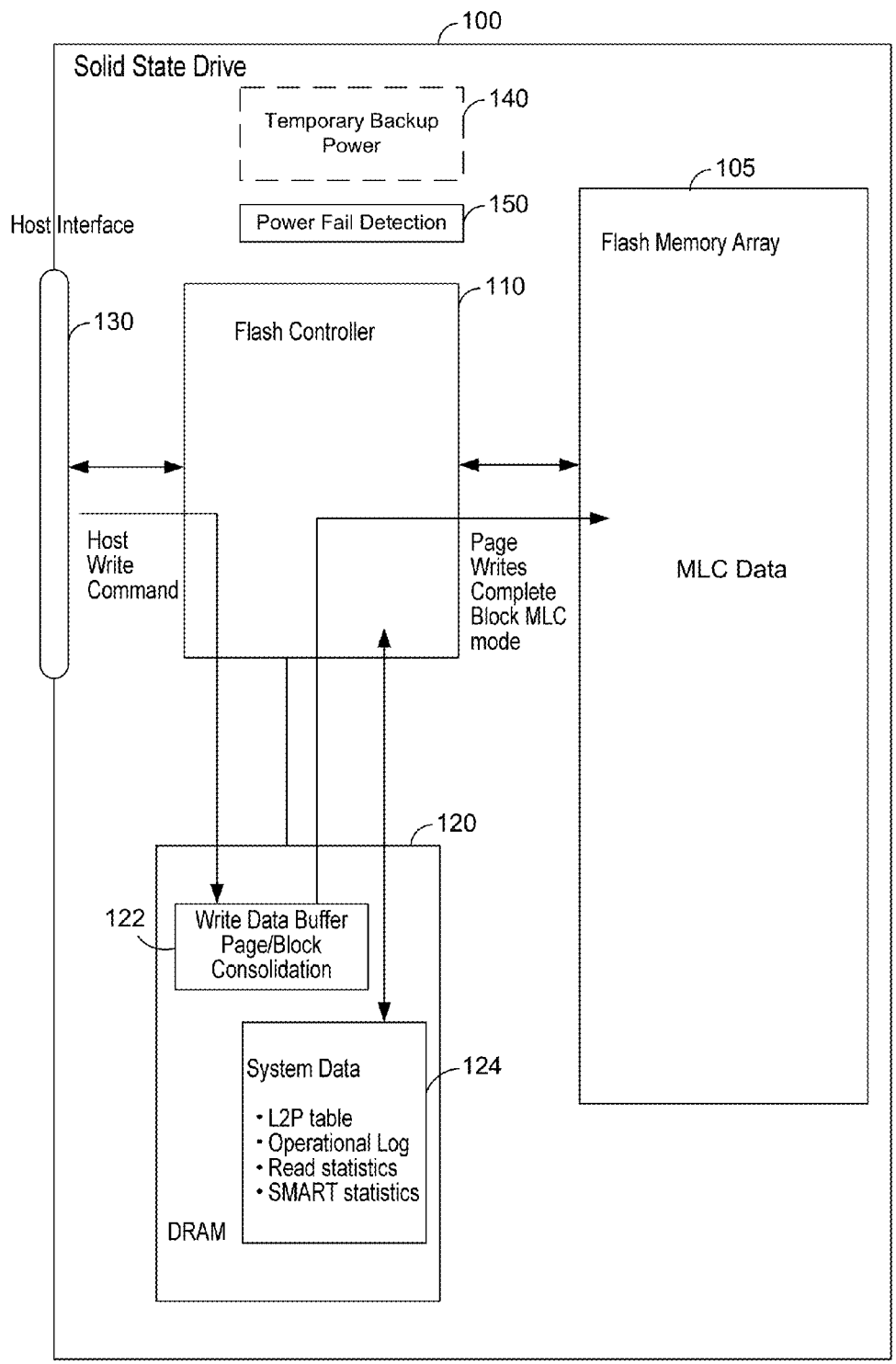
FIG. 1 illustrates a solid state drive in accordance with the prior art.
Figure 2A:
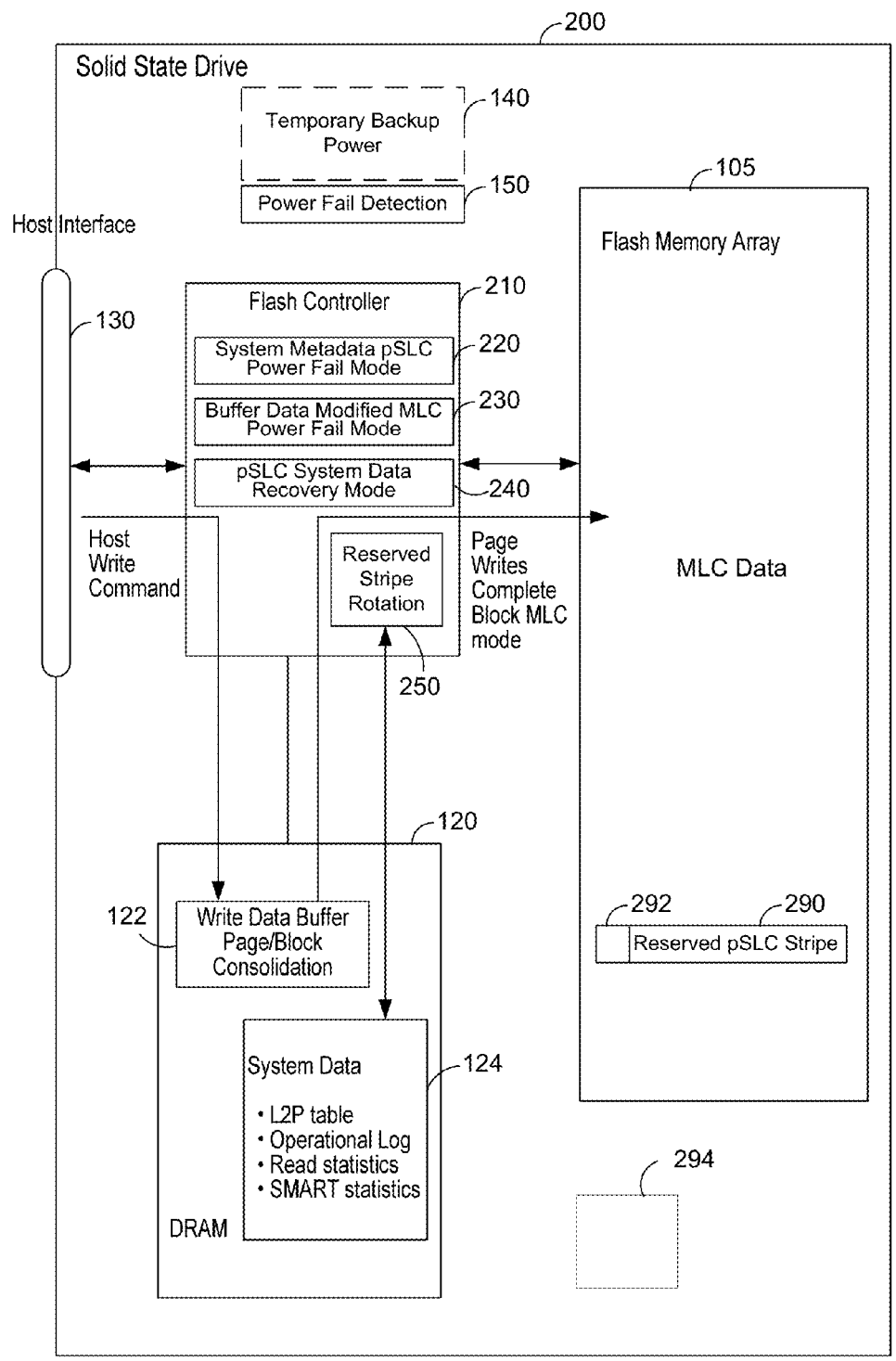
FIG. 2A illustrates a solid state drive in a normal operating mode in accordance with an embodiment of the present invention.

FIG. 2A is a schematic of a Solid State Drive (SSD) 200 operating in a normal multi-level cell (MLC) mode. The SSD 200 includes a flash memory array 105, a flash controller 210, and a dynamic random access memory (DRAM) 120. The DRAM 120 may be used to buffer user data with both read and write commands from the host to the flash memory controller 210. It may also be used to store system data such as L2P (Logical to Physical) address tables, an operational log (where the sequence of events processed by the controller can be saved for later inspection) and statistics concerning the read and write activity and SMART (Self-Monitoring, Analysis and Reporting Technology) data logging. This system data is commonly referred to as 'metadata' collectively.

For read commands, a portion of the DRAM 120 may be assigned to act as a read cache, where frequently accessed user data may be stored in the cache after reading from the memory array, and then subsequent reads for the same user data can be serviced more quickly from the cache. Since the data in cache is only a secondary copy of the data held in non-volatile flash memory, if the power fails no action need be taken to save or protect the data in the read cache, as the primary copy is always safe in the non-volatile flash memory array 105.

For write commands, the DRAM 120 may be used as a buffer to act as a staging point for user data being sent between the flash memory controller 110 and the flash memory array 105. Typically, writing directly to flash memory is much slower than writing to DRAM and data written to NAND flash memory must be written in units of flash pages (which can be relatively large compared to host file system cluster sizes at 8, 16, 32 KiB or more).

In the normal operating mode the drive reads and writes user data into the pages of flash memory blocks in the MLC mode. For the most reliable operation, flash erase blocks are filled to completion with page data. That is, in the normal MLC mode there is completion of blocks when writing data to protect already completed blocks. This is in accord with the standard practice of the industry associated with the problem that partially completed blocks typically display more errors.

The SSD may include or have access to a power failure detection circuit 150 to detect a power failure. The SSD may be packaged with or have access to a temporary backup power supply 140. During normal use, the SSD may obtain power from a main power supply or via the host interface. In any case, in the event of a power failure the SSD loses its source of power and the backup power supply 140 is designed to provide temporary power. To reduce costs, the temporary backup power supply 140 may be designed to provide the minimum power required for a graceful shutdown after a power failure and subsequent recovery when normal power is restored. This may include the backup power supply not having sufficient power for normal full functionality operation, nor for operation with reduced functionality for any appreciable length of time. The only requirement of the backup power supply is that it has sufficient capacity to last a long enough time (the 'hold up time') to enable important data held in the volatile DRAM 120 to be saved into non-volatile memory of the flash memory array 105. This includes the system metadata. Additionally, in an SSD that includes a write buffer, the buffered user data in transit needs to be saved. Thus in holdup time available, there are two main activities that are important to accomplish for a graceful shutdown and subsequent recovery. First, it is desirable to save user data written by the host that has been buffered in a write cache and already acknowledged by the flash controller to the host as having been successfully written. Second, it is desirable to save the system metadata stored by the flash controller in DRAM (for faster access). Saving the system metadata is important in order to permit the SSD to recover the correct state of metadata of the drive that matches with the user data that has been written.

In one embodiment, the flash memory controller 210 includes a system metadata pseudo single level cell (pSLC) power fail mode module 220, a write buffer data modified MLC power fail mode module 230, a pSLC system data recovery mode module 240, and a pSLC reserved stripe rotation module 250. These modules may be implemented in firmware or software. The flash memory controller 210 may be implemented in firmware and may include a processor (not shown) and local memory.

In one embodiment, the output of the power failure detection circuit is used to trigger a power fail saving mode. In the power fail saving mode, at least one of the following occurs: 1) a pseudo single level cell (pSLC) mode is used to store system metadata in nonvolatile memory; and 2) a modified MLC page write operation is performed for data in the write data block 122 that eliminates the need to write an entire erase block.

Figure 2B:
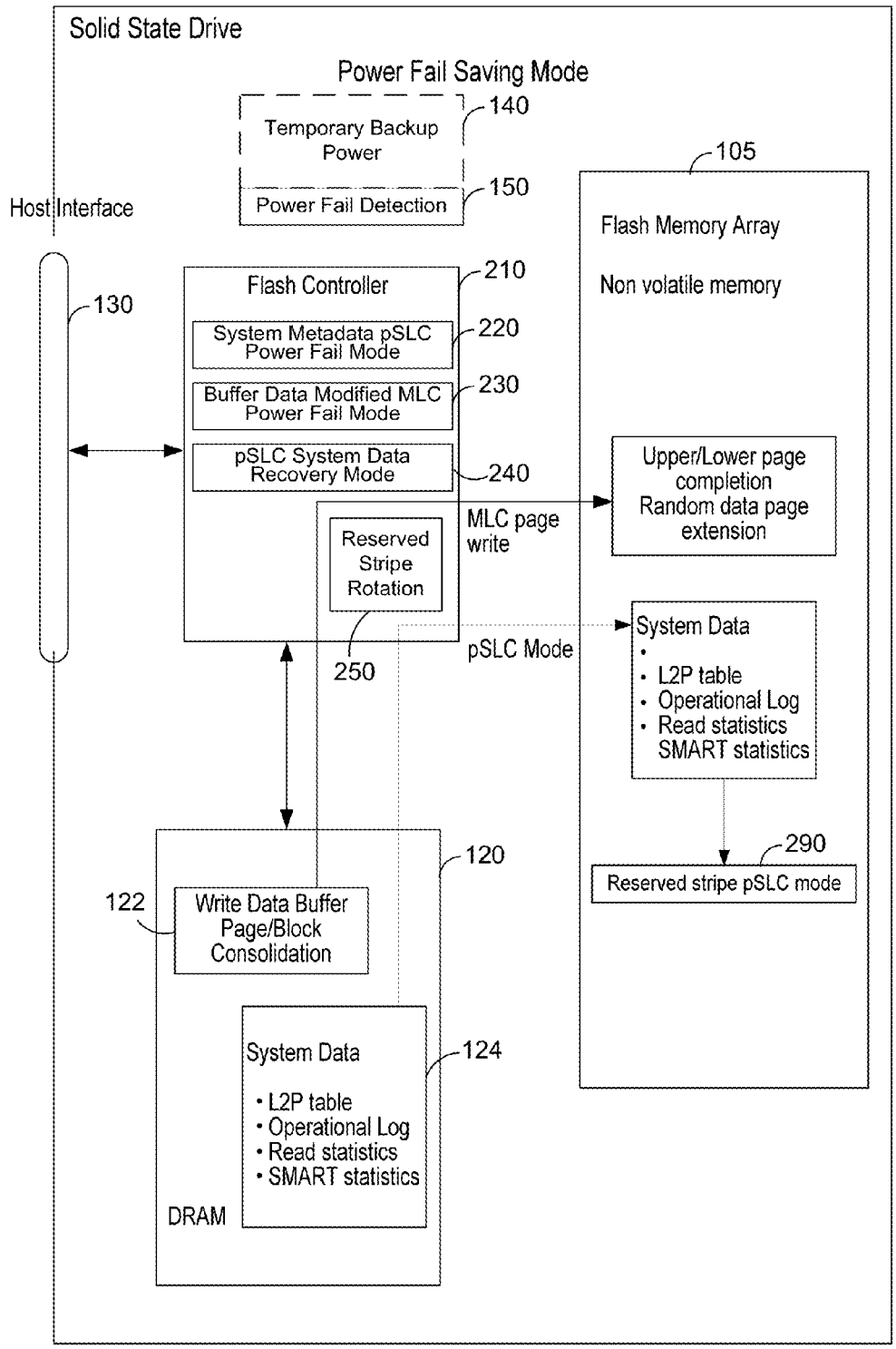
FIG. 2B illustrates the solid state drive in a power fail saving mode in accordance with an embodiment of the present invention.
Figure 3A:
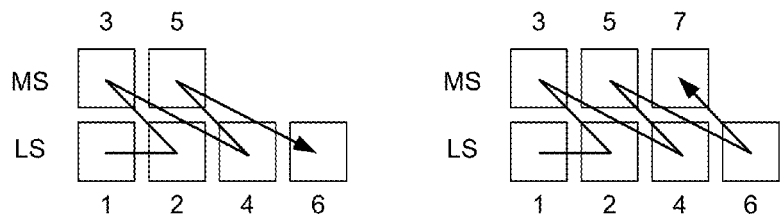
FIGS. 3A-E illustrate potential sources of corruption when writing a set of pages less than a full block in size.
Figure 3B:
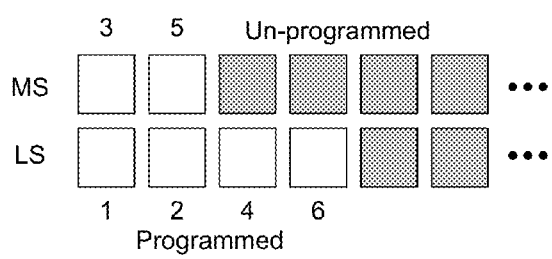
Figure 3C:
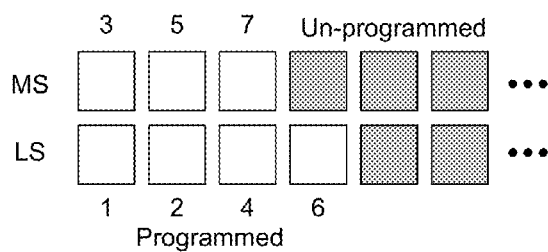
Figure 3D:
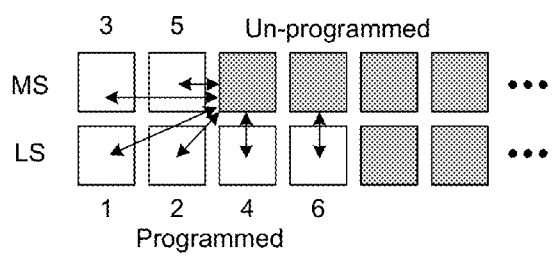
Figure 3E:
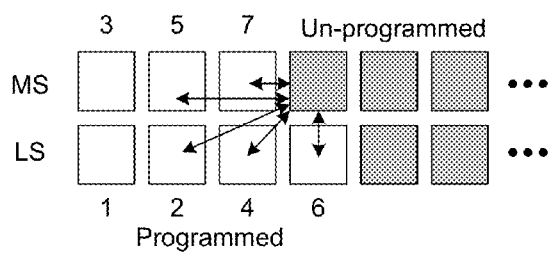
Figure 4A:
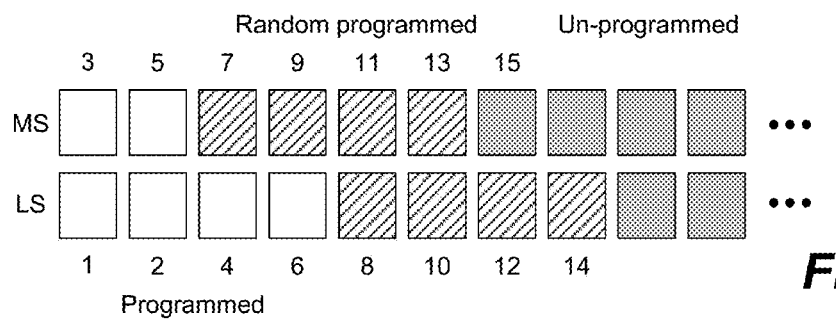
FIGS. 4A-D illustrate a technique to include dummy pages to provide protection against data corruption in accordance with an embodiment of the present invention.
Figure 4B:
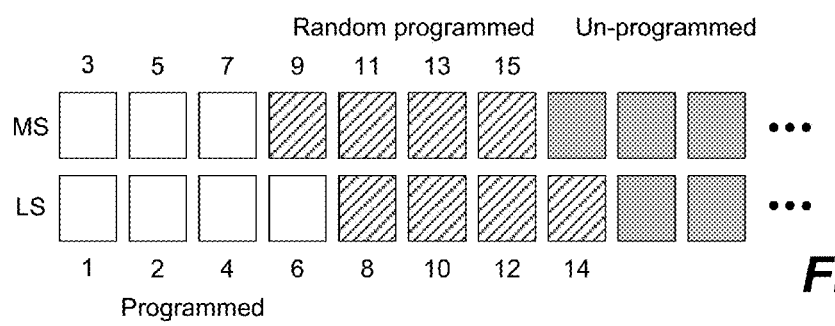
Figure 4C:
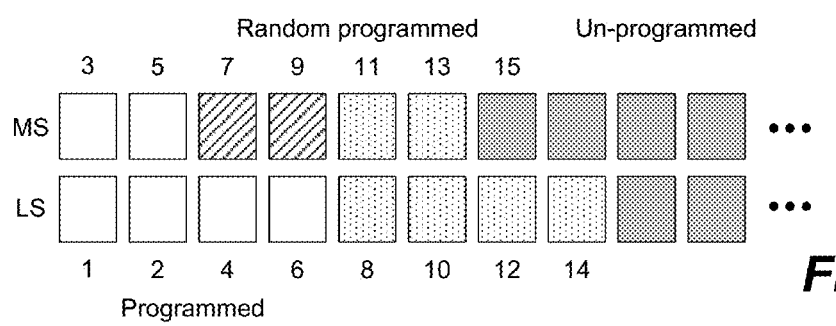
Figure 4D:
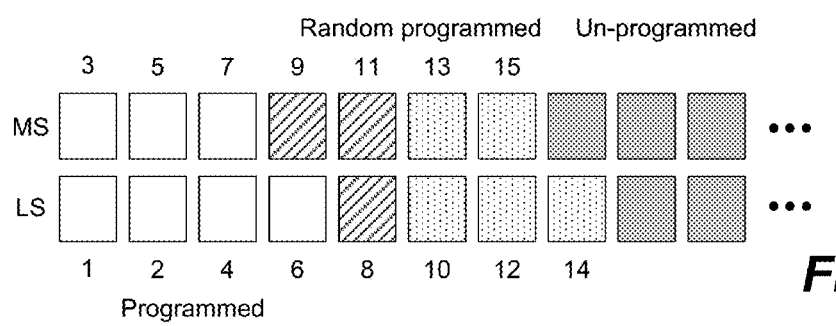

FIG. 2B is a schematic of the SSD in a power fail saving mode after the detection of a power failure in accordance with an embodiment of the present invention. When a power failure occurs, the SSD drive itself will no longer be able to derive power from the host and must continue in a self-sufficient power fail mode, where power is obtained from a backup supply 140, which may be provided by batteries, super-capacitors or some alternative power supply. The power fail saving mode supports the saving of essential volatile data during the holdup time. The interface to the host computer becomes inactive once the host power has failed.

In one embodiment, the power fail saving mode includes a pseudo single level cell (pSLC) mode to save system metadata 124 stored in volatile DRAM 120 to non-volatile MLC flash memory. The pSLC mode is a faster writing mode than MLC. In the pSLC mode, data is coded in SLC within an MLC memory. The pSLC mode enables the metadata to be saved more quickly and reliably than MLC mode. The pSLC mode reduces the amount of time to write data. Additionally, block filling may be removed because the susceptibility of data stored in pSLC mode to data corruption and errors is lower than with MLC mode. The required hold up time of the backup power supply, which is used when in power fail saving mode, is reduced. When the required hold up time is reduced, savings in the size and cost of the batteries or super-capacitors being used to provide the backup power can be made.

The system metadata 124 can be stored in a fixed region of the flash memory array 105, but this has several drawbacks, including preventing full operation of wear leveling and garbage collection. In one embodiment, in order to provide space for the system metadata to reside in pSLC mode, a reserved area of the flash memory array, known as a stripe 290 (a group of blocks logically combined to act as a larger data container that can be written in parallel) is prepared and made available. In order to make this area is consistent with flash management schemes of wear leveling and garbage collection, the stripe is preferably not a fixed area permanently allocated to this purpose. In one embodiment, the reserved stripe formed from a set of flash blocks dynamically allocated from the general pool of free erased flash blocks and set aside as a reserved area of memory ready to accept data written in pSLC mode.

The location of a stripe reserved to store system metadata is rotated throughout at least a major portion of the flash memory during the lifetime of the SSD. The rotation may be performed periodically based on a set time period (e.g., every five minutes) or other timing condition. Alternatively, it may be triggered on an event-driven basis. For example, an event that triggers the rotation of the location of a reserved stripe may include other stripes changing their erase counts and starting to diverge from the reserved stripe. Other examples of triggering events include the SSD drive experiencing an idle period and beginning background operations. In one embodiment, if a power failure has not occurred and the stripe has been unused, a new reserved stripe is allocated from the pool of erased blocks. The previous reserved stripe is then de-allocated and the blocks that comprised it are returned to the general pool of free erased blocks. In this way, the area being reserved for pSLC mode is not a permanently segregated section of memory but is dynamically allocated from the same pool of erased blocks being used for normal MLC write operations.

If the reserved stripe is used for saving metadata after a power fail event has occurred, the stripe is preserved until full power is next successfully restored to the SSD, whereupon a recovery procedure is used to read the data stored in pSLC mode in the reserved stripe and to use this data to update the normal versions of the metadata which are stored in MLC mode on the drive.

In one embodiment, a table of contents is created and stored in non-volatile memory to determine what data is saved in a power fail saving mode. In one embodiment, a first portion 292 of the reserved stripe stores a table of contents referencing what data is saved. The table of contents may, for example, be a table of data that was stored during a power fail saving mode. Storing a table of contents aids in performing a recovery mode in a bootup following a power failure. For example, anything not referenced by the table of contents may be ignored and not read during a recovery process.

In one embodiment, a small portion 294 of non-volatile memory is provided to store the reserved stripe location. This non-volatile memory may be located at different locations within the SSD and may also be a memory accessed via a serial peripheral interface (SPI) bus. In one embodiment, the current reserved stripe location and at least one previous reserved strip location (e.g., the last three locations) are stored in a separate non-volatile memory 294. Thus, after booting back up this reserved stripe location information can be used to scan for the reserved stripe location. In one embodiment, the most recent reserved stripe location is checked. If a reserved stripe is not found at the corresponding location, a search is then made for the next most recent strip location in non-volatile memory 294. For example, suppose the rotation of the stripe location occurs every five minutes. At some initial run time, suppose there is a reserved stripe A. Then, in this example, five minutes later a new stripe B is written. The rotation process is not instantaneous and includes steps for writing and confirmation of the new reserved stripe before the previous stripe is de-allocated. Saving a series of stripe locations is useful to address the situation where a power failure occurs in the middle of a rotation process, to address the possibility that the power failure occurs after a new stripe is allocated, but before it is written and the old stripe is de-allocated.

Referring again to FIG. 2B, in one embodiment the MLC data write mode for data in the write buffer 122 is modified in the power fail savings mode to eliminate the requirement to always fill a complete flash erase block with pages of user data/system data from the write data buffer for buffered data in transit. Conventionally, a flash erase block includes a large number of pages. If a block is left incomplete, it increases the risk that data may become corrupted. In one embodiment, one modification is to write a number of extra dummy pages of random data after the final valid page of data from the write data buffer has been written. The number of dummy pages is selected to provide a security buffer against corruption, but to be less than the total size of a conventional block. In doing so, the extra pages of random data provide a security buffer for the valid pages to protect against data corruption and errors, which may result from the flash block only being partially filled with valid pages. Any corruption and errors that may occur will instead only affect the dummy pages of random data, which is therefore of no consequence. The total number of dummy pages is less than that required to file a complete flash erase block. The total number of dummy pages that need to be written may be selected for a particular application based on empirical or heuristic analysis to determine an optimum minimum number of dummy pages.

In a power fail saving mode, the drive chooses to ignore the requirement to completely fill a flash block with valid pages. However, if this is done without performing additional steps the final valid pages of the block may be susceptible to corruption and errors. In one embodiment a small number of dummy pages are written after the final valid page of data. Additionally, the dummy pages may be written to have a charge distribution similar to that of the valid pages of data to avoid creating a large charge distribution. By writing a selected number of dummy pages of random data the drive completes the process of saving the user data in a more timely manner by not completely filling the flash data blocks with pages of user data. Additionally, as valid flash data is often written in scrambled form, programming the dummy pages with a random charge distribution prevents creating a large charge discontinuity at the interface of the final data pages.

FIG. 3 illustrates some of the issues that can occur when all of the pages of a block are not fully programmed. Flash memory is typically programmed to have LSB and MSB bits programmed at different times. If the power is removed after page n, it is not until page n+3 is programmed that the cells associated with page n have both the LSB and MSB programmed. FIG. 3a shows one possible relationship between logical page numbers and the physical layout in flash memory cells. The most significant (MS) bits and least significant (LS) bits are programmed at different times. A cell in MLC mode is not programmed with both bits in one operation. Instead, the cells are first programmed with one bit, then the other. To do this, two logical pages are associated with each physical page of memory, a least significant page and a most significant page. Logical pages are programmed in the numerical sequence as shown. Therefore, logical pages 1, 2, 4 and 6 are associated with the least significant bits of the first four cells; logical pages 3, 5, 7, are associated with the most significant bits of the first 3 cells. This means that if writing of the pages ends at logical page 6, then the third and fourth cells will be partly programmed as shown in FIG. 3b. Alternatively, if the writing of the pages ends at page 7, the fourth cell will be partly programmed as shown in FIG. 3c. Therefore, if all the pages of a block are not fully programmed, then it is inevitable that at least one page of cells and possibly two pages of cells will remain partly programmed. Then, as shown in FIGS. 3c and 3d, not only the partly programmed cells, but also those adjacent and next to adjacent become susceptible to corruption and errors.

FIG. 4 illustrates the benefits of including dummy random pages. In this example, the number of dummy pages is selected to be eight logical pages. That is, the number of dummy pages is selected to ensure that the cells associated with the last page of written data has both the MSB and LSB bits of the MLC cell programmed. Thus, after the last page is programmed with user data, a further eight logical pages are programmed with dummy random data, as shown in FIGS. 4a and 4b, where pages 7-14 or 8-15 respectively are programmed with random data. In this example, any corruption that may take place will only affect those dummy pages and the pages programmed with user data will remain unaffected, as shown in FIG. 4c and FIG. 4d.

Additionally, programming of random dummy pages also addresses another potential source of data corruption. Suppose, by way of illustration, that page n is written and then eight blank pages were written. However, when a NAND flash block is partially programmed to page n, this causes a potential discontinuity in the charge distribution at page n. A discontinuity means that charge may migrate across the boundary, affecting pages at either side of the boundary. In one embodiment, data is written in a scrambled form. Thus, page n is written with its data scrambled so that the data appears essentially random, no matter what the actual programmed data is. Thus, in the programmed data pages the average charge distribution of the scrambled data will have an average value between erased and programmed. If all of the dummy pages after page n were programmed to be fully erased it would create an abrupt charge discontinuity. Thus, in one embodiment the dummy pages are randomly programmed, resulting in them having a charge distribution similar to that in the last page of written (scrambled) data.

Figure 5:
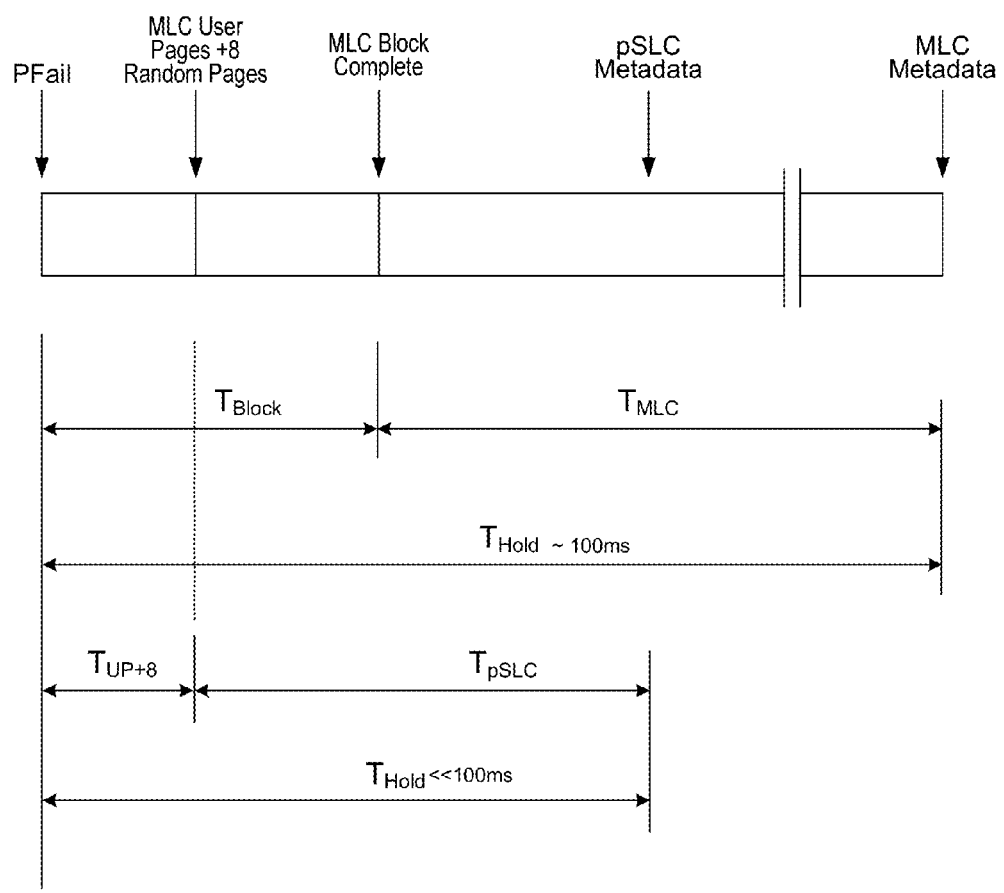
FIG. 5 illustrates a comparison of performance advantages in accordance with an embodiment of the present invention.

FIG. 5 illustrates hose the required holdup time effect is reduced by the present invention. As shown in the timing diagram in FIG. 5, where in the prior art the hold up time was the sum of the time taken to save the buffered data in flight in MLC mode as a complete block, $T_{Block}$, plus the time taken to save the system metadata in MLC mode in MLC flash, $T_{MLC}$. While this total time in the prior art depends on many factors, consider an illustrative example where it is on the order of 100 ms. By comparison, in an embodiment of the present invention, the time $T_{Block}$ can be reduced to $T_{UP+8}$ (the time to store the user pages in flight and the dummy pages). Additionally, the time to save the system metadata can be reduced to time to store the system metadata in pSLC mode, $T_{pSLC}$. The combined required hold up time will depend on factors such as the amount of data and other factors. Assume, for example, that in the pSLC mode it is <1 ms per page to program. In this example, suppose in MLC mode the average is typically around 1.3 to 1.9 ms per page. The time savings will include the time savings associated by the use of the pSLC mode and the time savings for not having to write an entire block for MLC data in-flight, which will depend on implementation details. For example, the number of pages per block will vary according to the size of the flash chip and manufacturer. In the case of flash devices between 16 Gbits and 128 Gbits the number of pages per block can vary between 128 and 512 pages per block. Thus, in many situations, not having to write the entire block results in a considerable time savings. The total result is that in many cases it is possible to achieve about a factor of two or three reduction in holdup time. This reduction in hold up time, in turn, permits a reduction in the size and cost of the hardware required to implement the backup power supply.

Figure 6:
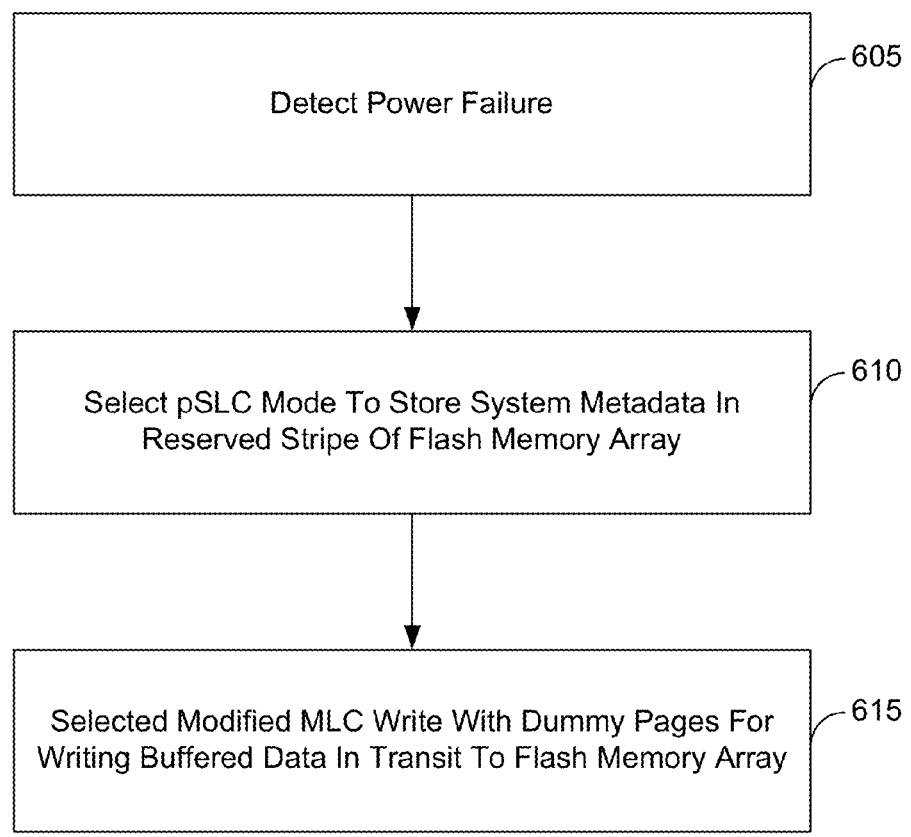
FIG. 6 is a flowchart illustrating controller actions in response to a power failure in accordance with an embodiment of the present invention.

FIG. 6 illustrates a power failure mode method in accordance with an embodiment of the present invention. A power failure is detected in block 605. The pSLC mode is selected 610 to store system metadata in the reserved stripe of the flash memory array. The modified MLC mode is selected to write buffered data in transit in block 615.

Figure 7:
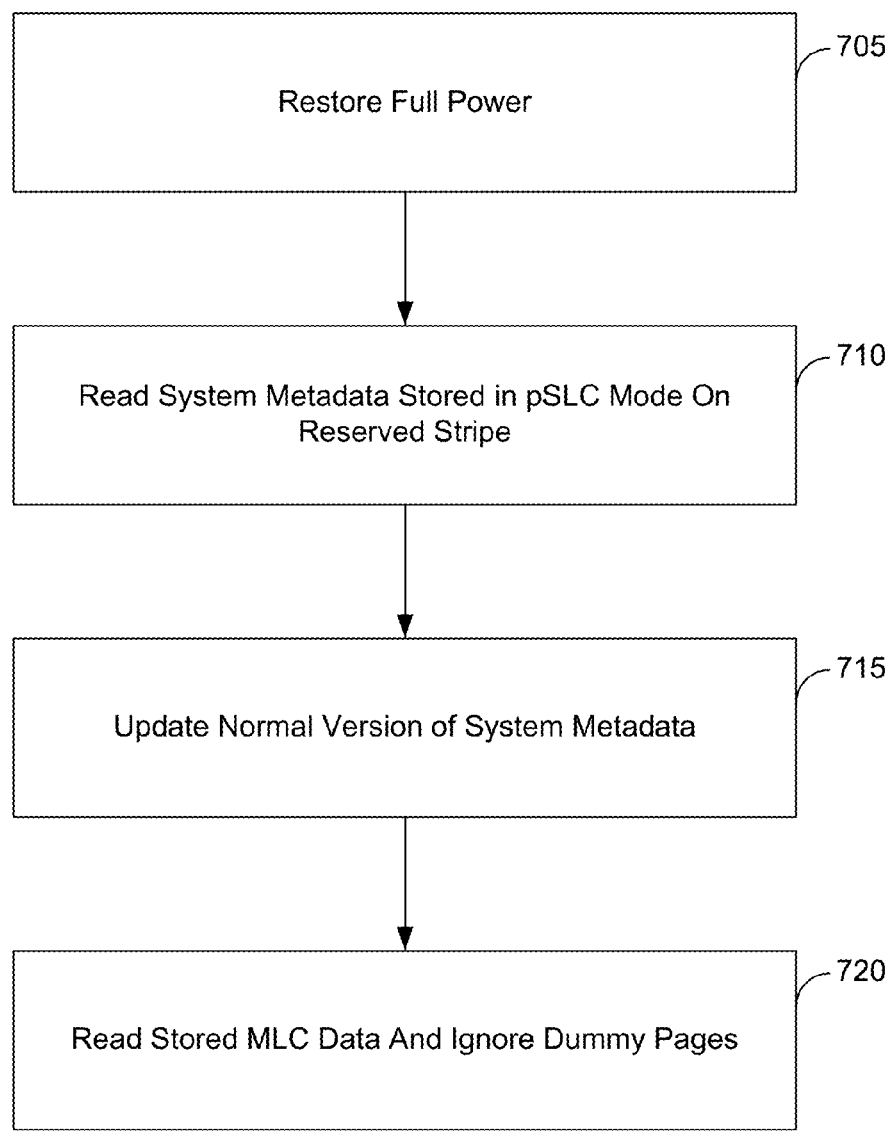
FIG. 7 is a flowchart illustrating recovery actions in a power-up after a power failure in accordance with an embodiment of the present invention.

FIG. 7 illustrates a method of recovering from a power failure in accordance with an embodiment of the present invention. In block 705, power is restored to the SSD. In block 710, system metadata stored in pSLC mode on the reserved stripe is read and is used to update 715 the system metadata used by the SSD. If a read is performed of the MLC, the dummy pages 720 are ignored by, for example, reading the table of contents stored in non-volatile memory during the power fail savings mode and ignoring pages not referenced by the table of contents.

Figure 8:
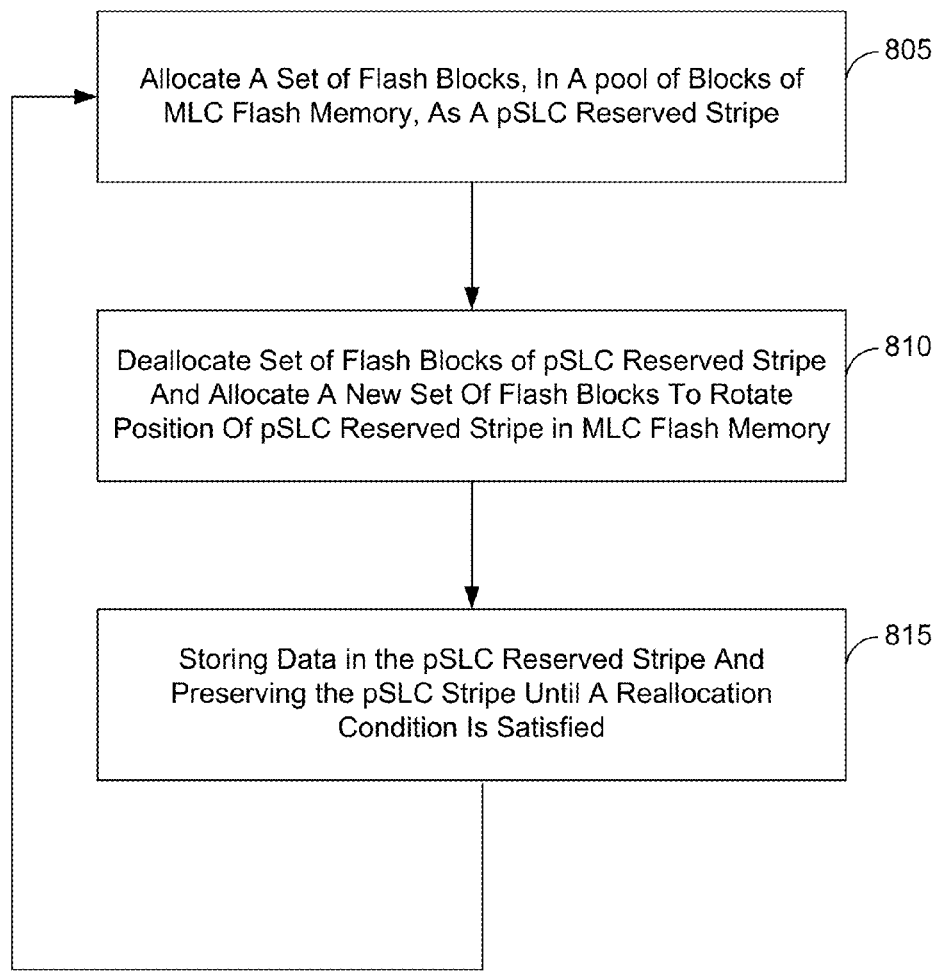
FIG. 8 is a flowchart illustrates aspects of pSLC reserved stripe use in accordance with an embodiment of the present invention.

While the reserved stripe may be used only for storing system metadata, there may be other applications as well. That is, a general method of rotating a pSLC stripe in MLC memory is believed to have general applicability in a variety of applications beyond a power fail savings mode. Referring to FIG. 8, in one embodiment, a set of flash blocks in a pool of MLC flash blocks is allocated 805 as a pSLC reserved stripe. At some later time or in response to a trigger condition, the reserved stripe is rotated in block 810 by de-allocating the blocks of the pSLC reserved stripe and allocating another set of flash blocks to rotate the positions of the pSLC reserved stripe. An algorithm can be used to select a new position from available blocks in the flash memory to prevent wear leveling. For example, the new position may be selected through various approaches such as by random selection of available blocks, iteration, or by keeping track of the locations of previous reserved stripes and selecting a new block selection to prevent wear leveling.

While the invention has been described in conjunction with specific embodiments, it will be understood that it is not intended to limit the invention to the described embodiments. On the contrary, it is intended to cover alternatives, modifications, and equivalents as may be included within the spirit and scope of the invention as defined by the appended claims. The present invention may be practiced without some or all of these specific details. In addition, well known features may not have been described in detail to avoid unnecessarily obscuring the invention. In accordance with the present invention, the components, process steps, and/or data structures may be implemented using various types of operating systems, programming languages, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. The present invention may also be tangibly embodied as a set of computer instructions stored on a computer readable medium, such as a memory device.

What is claimed is:

1. In a solid state drive, a power failure method comprising:
operating a flash memory in a multi-level cell (MLC) mode;
in response to detecting a power failure, initiating a power fail saving mode under backup power; and
in the power fail saving mode, saving system metadata in a region of the flash memory using a single level cell (SLC) mode.

2. The method of claim 1, further comprising:
in the power fail saving mode, saving buffered write data to flash memory in a modified MLC mode, the modified MLC mode comprising writing a sequence of pages of buffered write data followed by a sequence of dummy pages.

3. The method of claim 2, wherein the dummy pages comprise random data.

4. The method of claim 2, wherein the total number of pages of buffered write data and the sequence of dummy pages is less than a size of a flash erase block.

5. The method of claim 2, wherein the sequence of dummy pages consists of eight dummy pages with each dummy page having random data.

6. The method of claim 1, further comprising:
allocating a region of MLC flash memory as a reserved SLC stripe to store system metadata in the power fail saving mode.

7. The method of claim 6, further comprising rotating a location of the reserved SLC stripe through the MLC flash memory during a lifetime of the solid state drive.

8. The method of claim 7, comprising:
in response to a trigger condition, de-allocating blocks allocated to a reserved SLC stripe and allocating a new set of blocks to the reserved SLC stripe.

9. The method of claim 8, wherein the trigger condition comprises at least one of a timing condition and an event condition.

10. The method of claim 8, wherein the trigger condition and the rotation is selected to enable participation of the blocks allocated in the stripe in wear leveling and garbage collection.

11. The method of claim 1, further comprising:
recovering from a power failure and reading, in a SLC mode, the system metadata stored in the flash memory in the power fail saving mode.

12. In a solid state drive, a power failure method comprising:
operating a flash memory in a multi-level cell (MLC) mode including buffering write data in a write data buffer prior to writing write data to the flash memory, with page writes performed to have complete blocks of data written to the flash memory;
in response to detecting a power failure, initiating a power fail saving mode under backup power; and
in the power fail saving mode, writing any remaining data in the write data buffer to the flash memory in a modified MLC mode not requiring complete block of data written to the flash memory, wherein in the modified MLC the remaining data is written to a set of pages of the flash memory followed by a sequence of dummy pages.

13. The method of claim 12, wherein the remaining data is written as scrambled data and the dummy pages comprise random data.

14. The method of claim 13, wherein the sequence of dummy pages consists of eight dummy pages with each dummy page programmed with random data.

15. The method of claim 13, wherein the number of dummy pages is selected to eliminate data corruption associate with a charge discontinuity.

16. In a solid state drive, a power failure method comprising:
operating a flash memory in a multi-level cell (MLC) mode;
allocating a set of blocks of the flash memory as a single level cell (SLC) to form a reserved stripe;
rotating the allocation of blocks associated with the reserved stripe multiple times over a lifetime of the flash memory to enable participation of the blocks in wear leveling and garbage collection;
in response to detecting a power failure, initiating a power fail saving mode under backup power; and
in the power save mode, saving system metadata in the reserved stripe using a single level cell (SLC) mode.

17. The method of claim 16, further comprising:
in the power save mode, saving buffered write data to the flash memory in a modified MLC mode, the modified MLC mode comprising writing a sequence of pages of buffered write data followed by a sequence of dummy pages.

18. The method of claim 17, wherein the pages of buffered write data are scrambled and the dummy pages comprise random data.

19. The method of claim 18, wherein the total number of pages of buffered write data and the sequence of dummy pages is less than a size of a flash erase block.

20. In a solid state drive, a power failure method comprising:
operating a flash memory in a multi-level cell (MLC) mode in which write data is buffered in a write data buffer prior to being written to the flash memory and page writes to the flash memory are performed to have complete blocks of data written to the flash memory;
in response to detecting a power failure, initiating a power fail saving mode under temporary backup power;
in the power save mode, saving system metadata in a region of the flash memory using a single level cell (SLC) mode; and
in the power save mode, saving buffered write data to the flash memory in a modified MLC mode, the modified MLC mode comprising writing a sequence of pages of buffered write data followed by a sequence of dummy pages in which the total number of pages is less than a complete flash erase block.

21. A solid state drive, comprising:
a multi-level cell (MLC) flash memory controller including a power fail saving mode in which, in response to a power failure, system metadata is written in a Single Level Cell (SLC) mode to a region of flash memory.

22. The solid state drive of claim 21, wherein the MLC flash memory controller, in response to recovering from a power failure reads the region of flash memory in a SLC mode to recover system metadata.

23. The solid state drive of claim 21, further comprising:
a write buffer, the MLC flash memory controller in the power fail saving mode initiating a modified MLC mode, the modified MLC mode comprising writing a sequence of pages of buffered write data followed by a sequence of dummy pages, wherein the total number of pages of buffered write data and the sequence of dummy pages is less than a size of a flash erase block.

24. The solid state drive of claim 21, wherein the region of flash memory allocated to the SLC mode is rotated through the MLC flash memory during the lifetime of the MLC flash memory to enable participation of the region written in SLC mode in wear leveling and garbage collection.

* * * * *